US006705426B2

(12) United States Patent
Copetti

(10) Patent No.: US 6,705,426 B2
(45) Date of Patent: Mar. 16, 2004

(54) ACOUSTIC DIFFUSER AND METHOD OF PRODUCTION

(76) Inventor: Alessandro Copetti, Via S. Pecol, 18, 33013 Gemona del Friuli (UD) (IT)

( * ) Notice: Subject to any disclaimer, the term of this patent is extended or adjusted under 35 U.S.C. 154(b) by 37 days.

(21) Appl. No.: 10/040,732

(22) Filed: Dec. 28, 2001

(65) Prior Publication Data

US 2002/0085732 A1 Jul. 4, 2002

(30) Foreign Application Priority Data

Dec. 29, 2000 (IT) .................................... UD2000A0233

(51) Int. Cl.[7] .................................................. H05K 5/00

(52) U.S. Cl. ....................... 181/155; 181/151; 181/148; 181/153

(58) Field of Search ................................ 181/155, 153, 181/156, 151, 148; 295/160, 30, 199; D14/204; 381/345, 349

(56) References Cited

U.S. PATENT DOCUMENTS 3,720,787 A * 3/1973 Ishii et al. .................. 381/336
3,812,301 A * 5/1974 Lahti .......................... 381/341
4,869,340 A * 9/1989 Coudoux .................... 181/146
5,056,618 A * 10/1991 Prodan ....................... 181/199
5,368,270 A 11/1994 Wiwczar
5,661,271 A 8/1997 Moser
5,731,553 A * 3/1998 Ledoux ...................... 181/156

FOREIGN PATENT DOCUMENTS

DE 29 13 256 A 10/1980
GB 1 426 568 A 3/1976

* cited by examiner

*Primary Examiner*—Robert E. Nappi
*Assistant Examiner*—Renata McCloud
(74) *Attorney, Agent, or Firm*—Akin, Gump, Strauss, Hauer & Feld, L.L.P.

(57) ABSTRACT

Acoustic diffuser comprising a containing element able to contain at least a loudspeaker, wherein the containing element is formed by a monocoque made with granules of solid mineral held together by a cohesion material.

21 Claims, 3 Drawing Sheets

ACOUSTIC DIFFUSER AND METHOD OF PRODUCTION

FIELD OF THE INVENTION

The invention concerns an acoustic diffuser, ovaloid, ellipsoid or spheroid in shape, made in a monocoque so as to eliminate the acoustic reflections, refractions and vibrations which damage the quality of the sound.

The invention also concerns the method to produce said acoustic diffuser.

BACKGROUND OF THE INVENTION

The state of the art includes acoustic diffusers having containers composed of at least two semi-coques made of plastic material, plywood or composite materials, attached together and with a substantially box-like shape.

Such diffusers usually comprise at least a loudspeaker able to broadcast the sound, possibly associated with a printed circuit able to support an electric-acoustic filter, for example of the crossover type, an electric connector, for example of the jack type.

Acoustic diffusers made in this way create vibrations, reverberations, or other distortions inside, which affect the quality of the sound.

The present Applicant has devised and embodied this invention to overcome this shortcoming of the state of the art, and to obtain further advantages.

SUMMARY OF THE INVENTION

The invention is set forth and characterized essentially in the main claims, while the dependent claims describe other innovative characteristics of the invention.

One purpose of the invention is to achieve an acoustic diffuser which will prevent the formation of echoes, reverberations or vibrations inside it, and of refractions in the emission of sound.

Another purpose of the invention is to achieve an acoustic diffuser which is attached so as to limit the diffusion or transmission of contact vibrations, and which can be installed easily, and positioned at different heights, and directed at an angle in space.

Another purpose is to perfect a method which will allow to make a monocoque acoustic diffuser in a simple and efficient manner.

In accordance with these purposes the acoustic diffuser according to the invention comprises a containing element formed by a monocoque and at least a loudspeaker.

The monocoque is made from a compound of solid mineral aggregates, for example silicon, basalt and quartz, and a cohesion material, such as for example an epoxy resin, so as to limit the vibrations and to ensure a high structural density in order to optimize the frequency of resonance. The monocoque is substantially rounded in shape, such as for example ovaloid, ellipsoid or spheroid, in order to eliminate acoustic reflections and the formation of reverberations inside it.

The acoustic diffuser comprises, in one embodiment, an outer covering shell composed by an abradable resin, and an inner shell formed by plastic material. The two shells follow the outer, respectively inner, profile of the monocoque and provide the through holes able to house the loudspeaker and/or any other electric and electronic components such as, for example, connectors, pre-printed circuits, or for acoustic devices such as for example vents to allow the air, put under pressure by the movement of the loudspeaker, to exit from the containing element.

The acoustic diffuser also comprises support means which allow it to be fixed from above to at least one surface; in this case, they are formed by a steel cable which is inserted into a cavity of the containing element and a shock absorber element inserted between one end of the steel cable and the containing element, so as not to transmit the possible vibrations of the containing element to the surface.

The acoustic diffuser as described heretofore is made according to the following method.

The containing element is formed by inserting solid mineral aggregates, for example with a high level of hardness with a granulometry varying from about 1 mm to about 5 mm, inside a mold and the subsequent casting, or insertion under pressure, of a cohesion material into the same mold, so that the resulting containing element consists of a monocoque.

The mold has a substantially rounded inner surface, such as for example ellipsoid, ovaloid or similar, and is formed by two substantially symmetrical half-molds.

An inner shell is positioned inside the mold, so as to define an interspace inside which the granules and the cohesion material are cast.

In one embodiment, an outer shell is shaped on the inner surface of the mold, so as to form, together with the inner shell, an interspace inside which the granules of hard mineral, and subsequently the cohesion material, will be inserted.

Once the cohesion material has solidified, the two half-molds are removed and the surface finishing of the monocoque, or of the outer shell, is done, the loudspeaker is assembled, and any other possible electric and electronic components or acoustic devices provided.

BRIEF DESCRIPTION OF THE DRAWINGS

These and other characteristics of the invention will be apparent from the following description of a preferential form of embodiment, given as a non-restrictive example, with reference to the attached drawings wherein.

DETAILED DESCRIPTION OF PREFERRED EMBODIMENT

Figure 1:
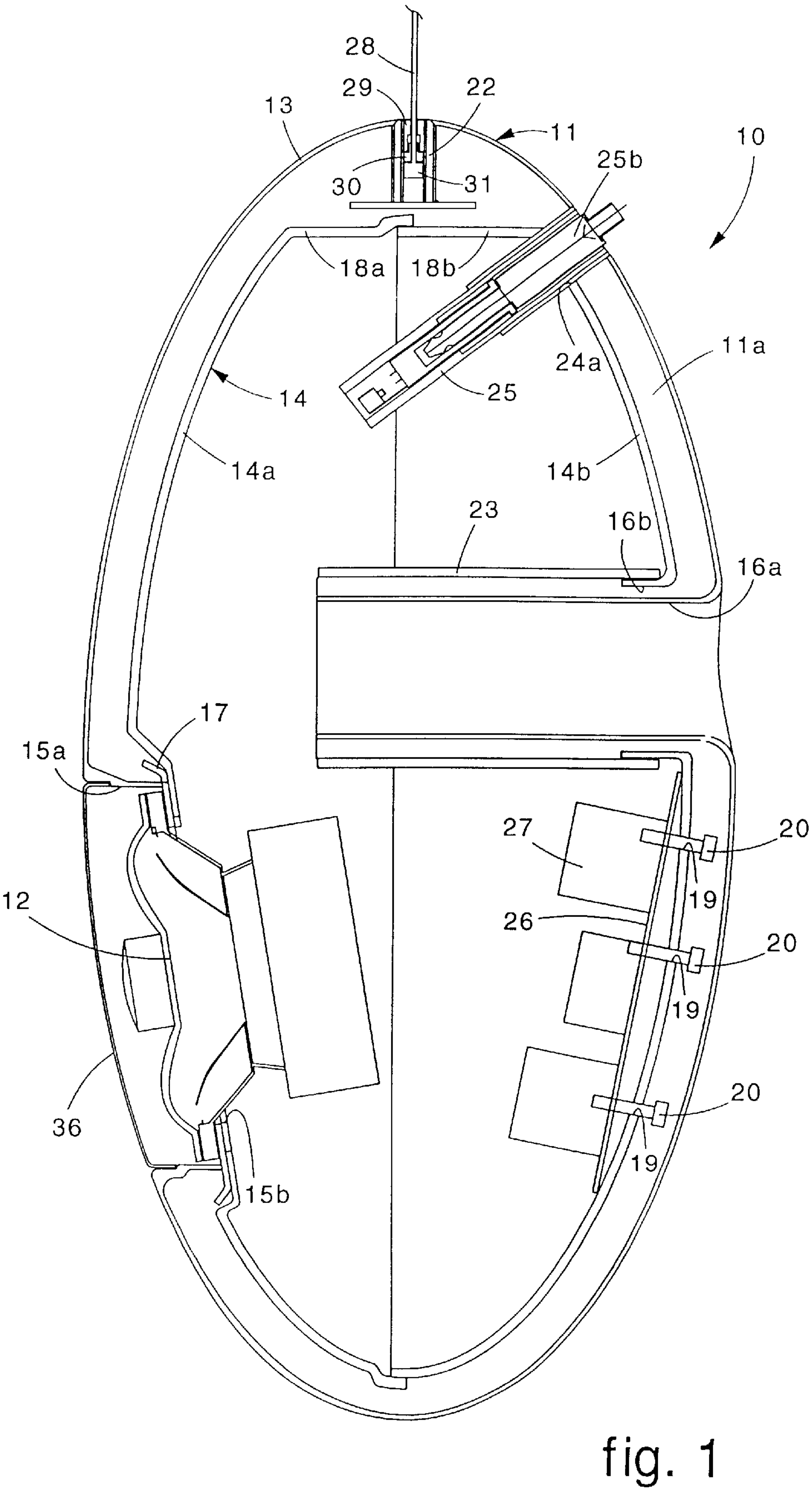
FIG. 1 is a sectioned side view of the acoustic diffuser according to the invention.
Figure 2:
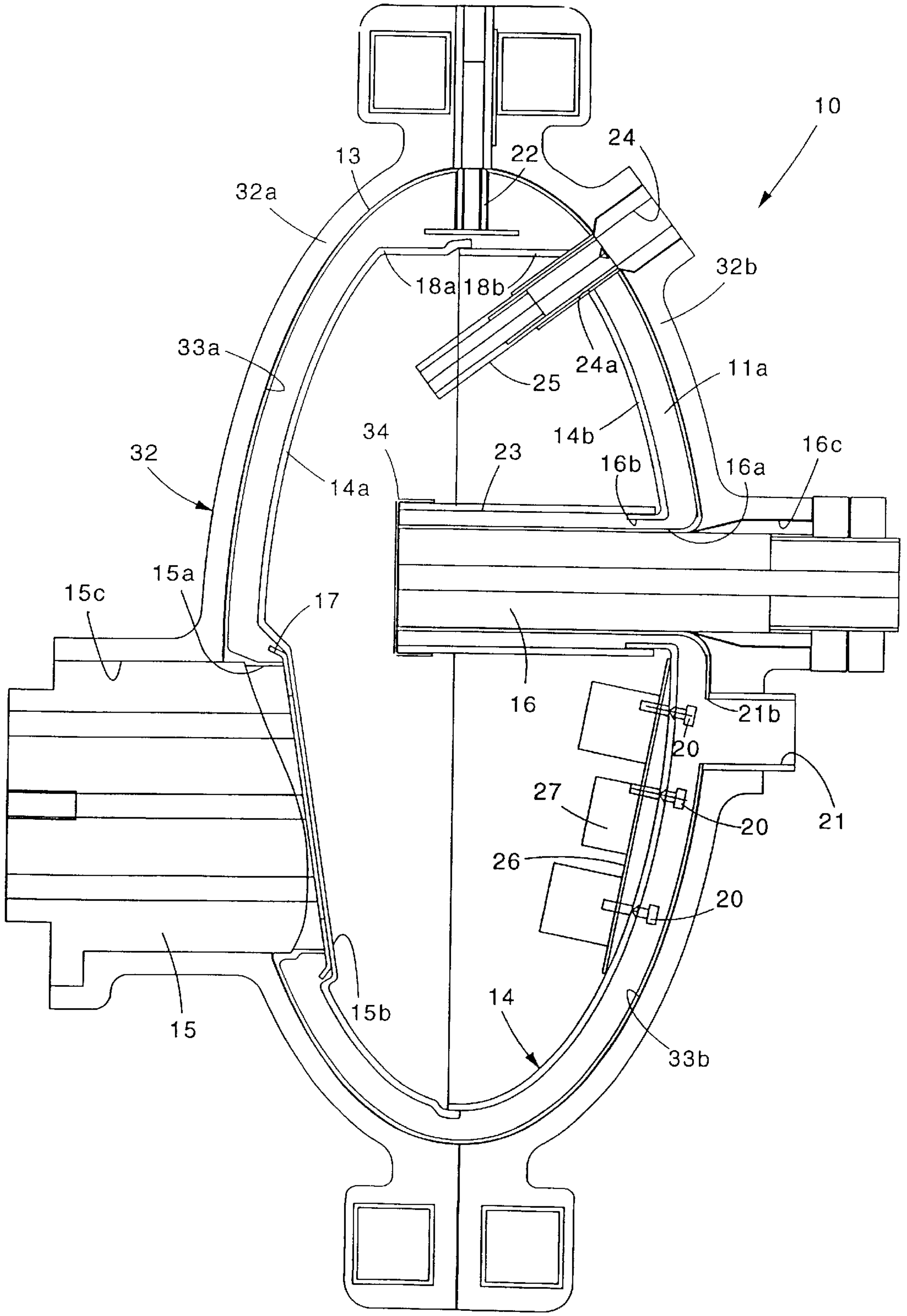
FIG. 2 is a sectioned side view of the molding of the acoustic diffuser shown in FIG. 1.

With reference to FIG. 1, the acoustic diffuser 10 according to the invention is substantially formed by a containing element 11 and a loudspeaker 12.

The containing element 11 is substantially ovaloid in shape, and is formed by a monocoque 11*a* made of a compound of granules of solid mineral such as, for example silicon and basalt, and a cohesion material such as for example an epoxy resin. The function of the compound is to raise the frequency of resonance with a dense and compact mass, of considerable weight, in the order of about 7 Kg, for a good physical-environmental balance, and to limit vibrations; the purpose of its shape is to eliminate the acoustic reflections and the formation of reverberations inside it.

The containing element 11 comprises an outer shell 13, made in this case from an abradable resin, disposed on the outer surface of the monocoque 11a, and an inner shell 14 formed by two half-shells 14a and 14b, advantageously made of plastic material, disposed on opposite sides of the inner surface of the monocoque 11a.

The outer shell 13 substantially comprises a hole 15a to house the loudspeaker 12 and to position a holed protection grid 36, of a conventional type, a hole 21b to allow the compound which constitutes the monocoque 11a to be cast, and a tubular recess 16a to allow the air moved by the action of the loudspeaker 12 to exit from the containing element 11.

The inner half-shell 14a comprises a hole 15b disposed, during use, in correspondence with the hole 15a of the outer shell 13 and, in the upper part, a plane portion 18a able to allow a bushing 22 to be housed.

The inner half-shell 14b comprises three holes 19 to house respective screws 20, a hole 16b disposed, during use, in correspondence with the tubular recess 16a of the outer shell 13, and able to be associated by means of glues with a tube 23, at least as long as the tubular recess 16a; moreover, the half-shell 14b comprises a through hole 24a able to couple with a mating connector support 25, advantageously made of stainless steel, and a plane portion 18b disposed during use as an extension of the corresponding plane portion 18a. The loudspeaker 12 is attached to the containing element 11 by means of a ring nut 17, advantageously made of stainless steel, attached to the half-shell 14a in correspondence with the hole 15b, while a printed circuit 26 for acoustic filters 27 of the crossover type is attached to the screws 20.

Finally, the bushing 22 is buried inside the monocoque 11a, in correspondence with the plane portions 18a and 18b, and a cable 28 is attached thereto by means of a dowel screw 29. The cable 28 is inserted longitudinally with play into the dowel screw 29 and comprises an abutment element or stopper 31 at one end, on which a bellows-shaped rubber 30 rests; during use, the rubber 30 is able to position itself between the stopper 31 and the dowel screw 29, absorbing any possible vibrations and movements of the containing element 11.

In order to make the acoustic diffuser 10 a mold 32 is used, formed by two half-molds 32a and 32b having respective inner surfaces 33a and 33b shaped so that, during use, they define a substantially ovaloid shape on which the outer shell 13 is shaped.

The half-mold 32a comprises a hole 15c able to house a metal mask 15 forming the shaped hole 15a of the outer shell 13, and to support, distancing it, the inner half-shell 14a, by means of attachment screws (not shown in the drawings).

The half-mold 32b, on the contrary, comprises a hole 21 disposed, during use, in correspondence with the hole 21b which allows the compound to be cast, a seating 16c able to house a second metal mask 16 able to define the tubular recess 16a, and finally a last hole 24 allows to insert the connector support 25 into the hole 24a.

After shaping the shell 13 respectively to the surfaces 33a and 33b, after positioning the two half-shells 14a and 14b inside the mold 32, after arranging the screws 20 in the relative holes 19, after inserting the connector support 25 into the hole 24a, and after positioning the bushing 22 above the plane portions 18a and 18b, the two half-shells 14a and 14b are reciprocally attached by means of glues so as to form the shell 14.

A structure is created by attaching the two half-molds 32a and 32b together, with inside the shell 13 and the inner shell 14 so that they form an interspace. The masks 15 and 16 are inserted, the tubular recess 16a is blocked with a stopper 34 and then the granules of solid mineral are inserted, simultaneously shaking the structure formed, in such a manner that the granules penetrate inside the whole interspace.

The subsequent step includes the pouring of the cohesion material, either under pressure or in a cast, until there is a slight overflow from the hole 21b or from possible vents.

After the cohesion material has solidified, the two half-molds 32a and 32b are dis-associated, and the loudspeaker 12, the printed circuit 26, a connector 25b and the cable 28 are assembled and electrically connected; it is also possible to line the inner part of the inner shell 14 with soundproofing material. There then follows the step of surface finishing, with sanding and painting of the outer surface of the shell 13.

Once assembled, the acoustic diffuser 10 communicates with the outside only by means of the tubular recess 16a, since all the other apertures are air tight.

Figure 3:
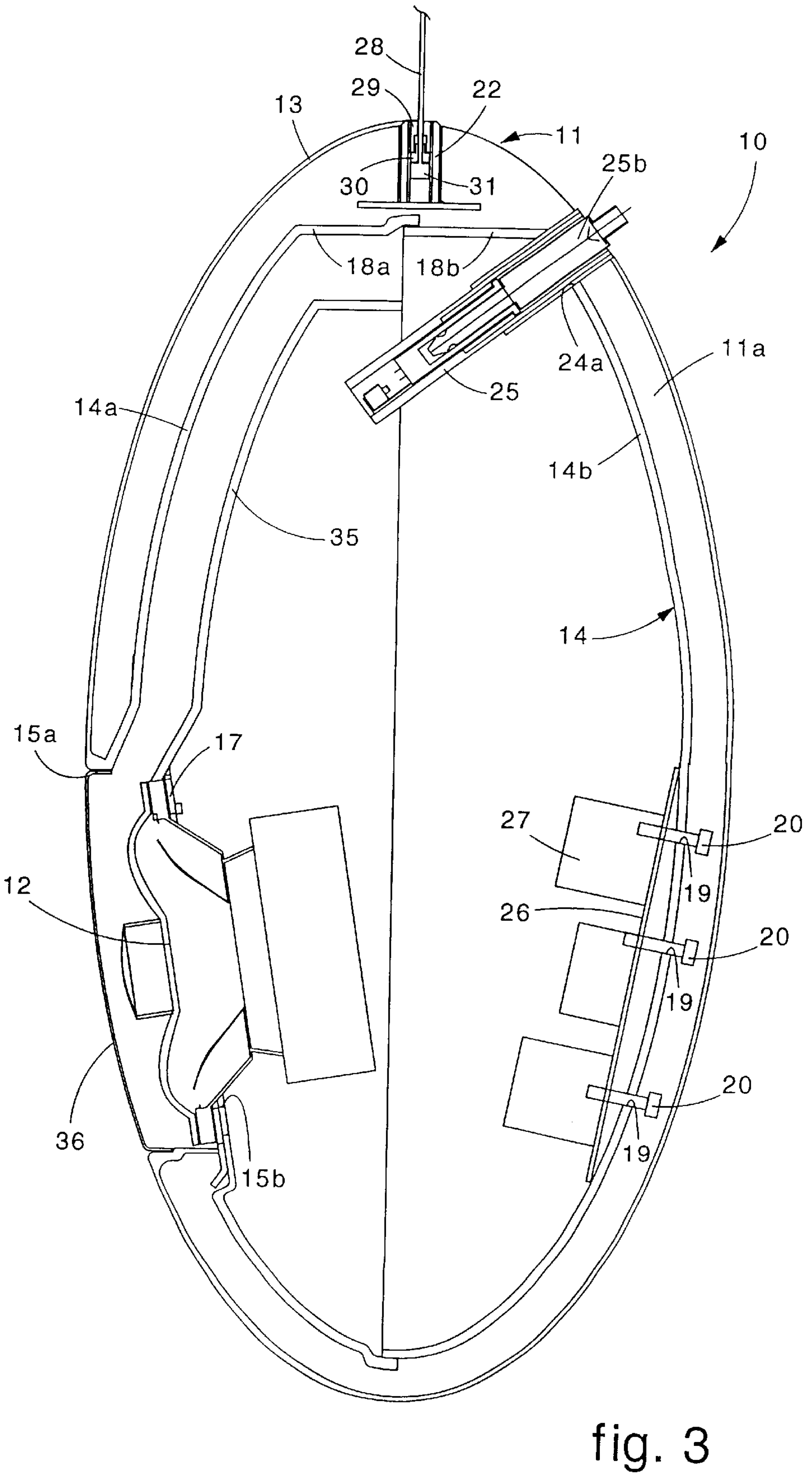
FIG. 3 shows a variant of FIG. 1.

According to a variant shown in FIG. 3, the tubular recess 16a is replaced by a wall 35, substantially parallel to the half-shell 14a, and open in proximity with the hole 15a of the shell 13.

According to another variant, not shown in the drawings, two bushings 22 are disposed on opposite sides so as to allow the containing element 11 to be attached to two opposite surfaces, in order to prevent it from oscillating.

It is clear however that modifications and/or additions can be made to the acoustic diffuser 10 and its method of production as described heretofore without departing from the spirit and scope of the invention.

For example, the solid material which makes up the monocoque 11a of the containing element 11 can consist of a metal such as aluminium, steel or otherwise.

It is also clear that, although the invention has been described with reference to specific examples, a person of skill in the art shall certainly be able to achieve many other equivalent forms of acoustic diffuser and its production method, all of which shall come within the field and scope of this invention.

What is claimed is:

1. An acoustic diffuser comprising a containing element for containing at least a loudspeaker, wherein said containing element is formed by a monocoque made with granules of solid mineral held together by a cohesion material, and further comprising a holding means for suspending said containing element from above said containing element so as to prevent transmission of vibrations and resonances, wherein said holding means comprises a steel cable inserted with play into a through hole of said containing element and a shock absorber element located between one end of said steel cable and said containing element.

2. The acoustic diffuser of claim 1, wherein said solid mineral is selected from the group consisting of silicon, basalt, corundum and quartz.

3. The acoustic diffuser of claim 1, wherein said cohesion material comprises an epoxy resin.

4. The acoustic diffuser of claim 1, wherein said monocoque is rounded in shape so as to eliminate acoustic reflections, refractions and formation of reverberations inside said containing element.

5. The acoustic diffuser of claim 4, wherein said shape is selected from the group consisting of round, ovaloid, ellipsoid and spheroid shapes.

6. The acoustic diffuser of claim 1, wherein said monocoque comprises a covering outer shell made of an abradable resin.

7. The acoustic diffuser of claim 1, wherein said monocoque comprises an inner shell made of plastic.

8. The acoustic diffuser of claim 7, wherein said inner shell comprises two half-shells attached together by glue.

9. The acoustic diffuser of claim 7, wherein said inner shell comprises an inner wall lined with sound-proofing material.

10. The acoustic diffuser of claim 7, wherein said loudspeaker is attached to said containing element by means of a ring nut attached to said inner shell and to said monocoque.

11. The acoustic diffuser of claim 7, wherein a printed circuit is assembled inside said containing element by means of support means mounted on said inner shell.

12. The acoustic diffuser of claim 1, wherein at least one of an electric and an electronic connector is housed in a mating support which in turn is buried in said containing element.

13. The acoustic diffuser of claim 1, wherein said containing element comprises a first through hole for housing said loudspeaker and at least a second through hole for allowing air under pressure for operation of said loudspeaker to exit.

14. An acoustic diffuser comprising a containing element for containing at least a loudspeaker, wherein said containing element is formed by a monocoque made with granules of solid mineral held together by a cohesion material, and further comprising a holding means for suspending said containing element from above said containing element so as to prevent transmission of vibrations and resonances, wherein said holding means comprises a steel cable, a bushing threaded internally and incorporated in said monocoque, and a mating threaded element for coupling with said threaded bushing and having a through hole in which said steel cable is housed.

15. A method of making an acoustic diffuser comprising a containing element and at least a loudspeaker, comprising the steps of: inserting granules of solid mineral into a mold and subsequently casting a cohesion material inside said mold to amalgamate said granules so that when said cohesion material is solidified said containing element substantially consists of a monocoque, positioning an inner shell inside said mold to define an interspace for insertion of said granules and said cohesion material, and disposing support means in said inner shell for supporting a printed circuit, at least an electric connector for said loudspeaker or holding means for holding said containing element.

16. The method of claim 15, wherein said solid mineral comprises an aggregate selected from the group consisting of silicon, basalt, corundum and quartz.

17. The method of claim 15, wherein said cohesion material comprises an epoxy resin.

18. The method of claim 15, wherein said mold comprises two substantially symmetrical half-molds shaped so as to define an inner surface of rounded shape.

19. The method of claim 18, wherein said shape is selected from the group consisting of round, ovaloid, ellipsoid and spheroid shapes.

20. The method of claim 15, wherein when said cohesion material is solidified, performing the following further steps: removing said mold, surface finishing said outer shell, and mounting said loudspeaker, said printed circuit, said electric connector and said holding means on said inner shell.

21. A method of making an acoustic diffuser comprising a containing element and at least a loudspeaker, comprising the steps of inserting granules of solid mineral into a mold and subsequently casting a cohesion material inside said mold to amalgamate said granules so that when said cohesion material is solidified said containing element substantially consists of a monocoque, and disposing an outer shell against the inner surface of said mold to define the outer surface of said monocoque.

* * * * *